United States Patent
Metzler et al.

(10) Patent No.: US 10,028,409 B1
(45) Date of Patent: Jul. 17, 2018

(54) IMMERSION COOLING ARRANGEMENTS

(71) Applicant: Hamilton Sundstrand Corporation, Charlotte, NC (US)

(72) Inventors: Mark W. Metzler, Davis, IL (US); John Huss, Roscoe, IL (US); Ernest Thompson, Janesville, WI (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 15/400,110

(22) Filed: Jan. 6, 2017

(51) Int. Cl.
*H05K 7/20* (2006.01)

(52) U.S. Cl.
CPC .............................. *H05K 7/20236* (2013.01)

(58) Field of Classification Search
None
See application file for complete search history.

(56) References Cited

U.S. PATENT DOCUMENTS

| | | | | |
|---|---|---|---|---|
| 4,944,401 A | * | 7/1990 | Groenewegen | H05K 5/0213 174/544 |
| 5,305,184 A | * | 4/1994 | Andresen | H01L 23/44 165/104.33 |
| 6,139,361 A | * | 10/2000 | Przilas | H05K 7/20345 439/559 |
| 6,148,899 A | * | 11/2000 | Cornie | B22D 18/04 164/120 |
| 7,180,751 B1 | * | 2/2007 | Geschke | H01R 13/6658 361/758 |
| 7,609,518 B2 | * | 10/2009 | Hopton | G06F 1/20 165/104.33 |
| 8,081,467 B2 | * | 12/2011 | Taylor | H05K 7/20409 257/706 |
| 8,432,695 B2 | * | 4/2013 | Yoshikawa | H01L 23/4006 165/185 |
| 9,648,769 B2 | * | 5/2017 | Tramet | H05K 7/1432 |
| 9,711,432 B2 | * | 7/2017 | Riou | H01L 23/44 |
| 2013/0021752 A1 | * | 1/2013 | Campbell | H05K 13/00 361/700 |
| 2013/0139998 A1 | * | 6/2013 | Hayashi | H01L 23/473 165/47 |
| 2014/0218859 A1 | * | 8/2014 | Shelnutt | G06F 1/206 361/679.46 |

OTHER PUBLICATIONS

U.S. Appl. No. 14/996,472, filed Jan. 15, 2016, Swenson et al.

* cited by examiner

*Primary Examiner* — Courtney Smith
(74) *Attorney, Agent, or Firm* — Locke Lord LLP; Scott D. Wofsy; Christopher J. Cillié

(57) ABSTRACT

An immersion cooling arrangement includes a housing containing a liquid coolant. An electrical device is submerged within the liquid coolant. A printed wiring board is seated on the housing and separates the coolant from the environment external to the housing to provide penetration-free electrical communication between a power source and the electrical device.

17 Claims, 3 Drawing Sheets

IMMERSION COOLING ARRANGEMENTS

BACKGROUND OF THE INVENTION

1. Field of the Invention

The present disclosure relates to heat removal from electrical devices, and more particularly heat removal from electrical devices using immersion cooling.

2. Description of Related Art

Electrical devices, such as in aircraft electrical systems, typically generate heat due to resistive heating form current flow through current-carrying components. In some electrical devices heat generation can be such that it is necessary to immerse the electrical device in a coolant, heat generated by the resistive heating transferring into the coolant, and therethrough to the external environment. In immersion cooled electrical devices, heat from electrical device typically changes from a liquid to a gas, rises to the top of a vessel containing the coolant and condenses, thereby transferring heat to the vessel and therethrough to the external environment.

Since the vessel containing the coolant typically separates the electrical device from the power source powering the electrical device, conductors providing power to the electrical device must penetrate the vessel. The penetrations are typically electrically insulated to insulate the vessel from the conductor and sealed to prevent coolant from traversing the penetration. Insulation and sealing is typically effected by a feed-thru which seats in the penetration. Feed-thru arrangements typically include ceramic discs, which may be welded to the conductor and vessel, and gaskets, which compressively seat between the conductor and vessel.

Such conventional methods and systems have generally been considered satisfactory for their intended purpose. However, there is still a need in the art for improved immersion cooling arrangements and methods of cooling electrical devices. The present disclosure provides a solution for this need.

SUMMARY OF THE INVENTION

An immersion cooling arrangement includes a housing containing a liquid coolant. An electrical device is submerged within the liquid coolant. A printed wiring board (PWB) is seated on the housing and separates the coolant from the environment external to the housing to provide penetration-free electrical communication between a power source and the electrical device.

In certain embodiments, the electrical device can include a power converter, an inductor, or a motor drive. The liquid coolant can include a dielectric coolant. The housing can have an open side. The PWB can seat against the open side of the housing, hermetically covering the open side of the housing. A reinforcing body can span the PWB and couple to the PWB to the housing. The reinforcing body can include a mesh body or a strap. The reinforcing body can also include a bracket or metal core integral with the PWB.

In accordance with certain embodiments, the PWB can be penetration-free. The PWB can include a wiring trace. The wiring trace can be in electrical communication with the electrical device. An outer connector can be coupled to an external surface of the PWB. The outer connector can be electrically connected to the electrical device. The outer connector can extend only partially through a thickness of the PWB. An inner connector can be couple to an inner surface of the PWB. The inner connector can extend only partially through the thickness of the PWB. The inner connector can be electrically connected to the electrical device.

It is contemplated that the inner connector can be disposed within an ullage space defined within an interior of the housing. A heat sink can connected to an outer surface of the PWB. A condenser can be connected to outer surface of the PWB. The wiring trace can define a hermetic seal defined between the PWB and the housing. The outer and inner connectors can connect to the wiring trace on opposite sides to provide a penetration-free, hermetic sealing, and electrical communication from an external power source to the electrical device within the housing interior.

It is also contemplated that, in accordance with certain embodiments, a fastener pattern can couple the PWB to the housing. The fastener pattern can be arranged about the periphery of the PWB. A hermetic seal can be arranged between the PWB and the housing. The seal can extend about an open side the housing and between the housing and the PWB. The seal can be arranged laterally inward of the fastener pattern. The seal can be arranged between the fastener pattern and the interior of the housing. The seal can include a gasket interposed between the housing and the PWB. The seal can include solder extending between the housing and the PWB.

An immersion cooling arrangement includes a housing containing a liquid coolant, an electrical device submerged within the liquid coolant, and a PWB. The PWB includes a conductive trace fixed to the housing and separates the coolant from the environment external to the housing. An outer connector is coupled to an external surface of the PWB and is electrically connected to the conductive trace. An inner connector is coupled to an internal surface of the PWB and electrically connected to the conducive trace. The conductive trace hermetically separates the outer connector from the inner connector.

In certain embodiments, the conductive trace can extend laterally between the outer and inner connectors. The conductive trace can be disposed on the external surface of the PWB. The conductive trace can be disposed within an interior of the PWB. The conductor trace can be disposed on the internal surface of the PWB.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
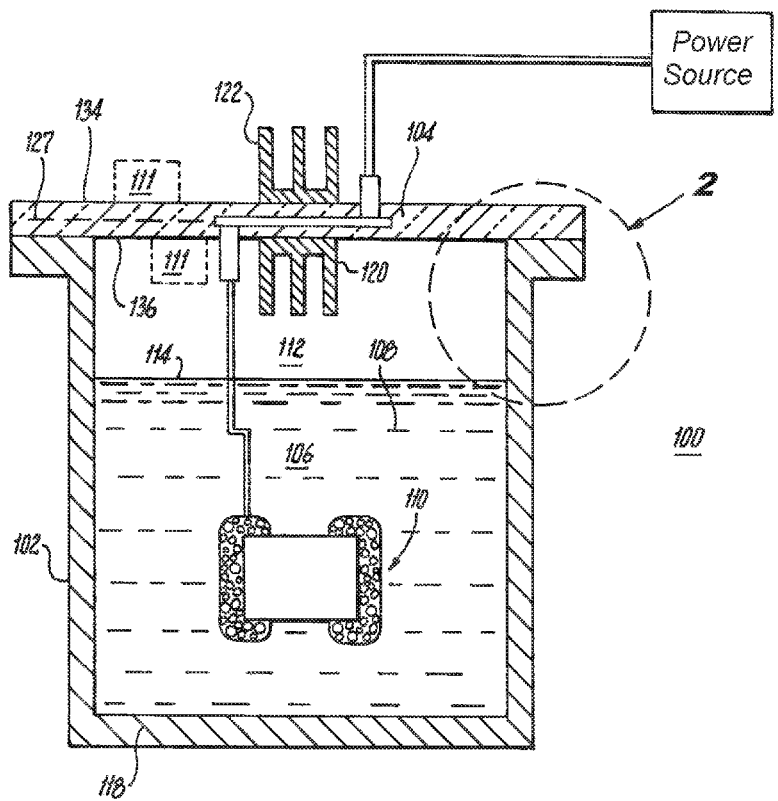
FIG. 1 is a cross-sectional side view of an exemplary embodiment of an immersion cooling arrangement constructed in accordance with the present disclosure, schematically showing an electrical device submerged within the housing interior and electrically connected to an external power source through a printed wiring board (PWB) covering the housing.

Reference will now be made to the drawings wherein like reference numerals identify similar structural features or aspects of the subject disclosure. For purposes of explanation and illustration, and not limitation, a partial view of an exemplary embodiment of an immersion cooling arrangement in accordance with the disclosure is shown in FIG. 1 and is designated generally by reference character 100. Other embodiments of immersion cooling arrangements and methods of transferring heat between the ambient environment and immersion cooling arrangement in accordance with the disclosure, or aspects thereof, are provided in FIGS. 2-5, as will be described. The systems and methods described herein can be used cooling electrical devices in aircraft electrical systems, such as in immersion cooling arrangements for high voltage electrical devices, though the present disclosure is not limited to high voltage electrical devices or to aircraft electrical systems in general.

Referring to FIG. 1, immersion cooling arrangement 100 is shown. Immersion cooling arrangement 100 includes a housing 102 and a printed wiring board (PWB) 104. Housing 102 has an interior 106 containing a liquid coolant 108 and an electrical device 110. Electrical device 110 is positionable within housing 102. PWB 104 is sealably engaged to housing 102 and separates coolant 108 within housing 102 from the external environment. In the illustrated exemplary embodiment electrical device 110 is at least partially submerged within liquid coolant 108 for transferring heat between electrical device 110 and the ambient environment outside of housing 102. It is contemplated that immersion cooling arrangement cool electrical device 100 by removing heat therefrom, for example by transferring heat generated by current-carrying elements of electrical device 110 into liquid coolant 108, through an ullage space 112 defined between a surface 114 of liquid coolant 108, and thereafter through PWB 104.

Electrical device 110 can include a high-voltage electrical device. As will be appreciated by those of skill in the art in view of the present disclosure, submerging electrical device 110 within liquid coolant 108 provides coolant to substantially all exposed surfaces of electrical device 110, which enables the use of higher voltages, e.g., 270 or 540 volts, than otherwise could be possible. In certain embodiments electrical device 110 includes an inductor, a power converter, and/or a motor controller, although other electrical devices will also benefit from embodiments of immersion cooling arrangements described herein. Although described herein as providing electrical communication with an electrical device disposed within interior 106, in certain embodiments PWB can also support an electrical device, e.g., a second electrical device 111, within interior 106 and/or externally of immersion cooling arrangement 100.

Liquid coolant 108 includes an electrically insulative, thermally conductive material, and may be a dielectric coolant. Examples of suitable dielectric coolants include fluorocarbons such as perfluorohexane (FC-72), perfluoro (FC-75), and/or perfluorotripentylamine (FC-70). FC-72, FC-75, and FC-70 are available under the tradename Flourinert® from the 3M Company of Maplewood, Minn. Liquid coolant 108 is distributed between a liquid phase coolant portion, located in a lower portion (relative to the direction of gravity) of housing 102 and bounded by surface 114, and vapor phase coolant occupying an ullage space 112 defined within interior 106 between surface 114 and PWB 104.

In the illustrated exemplary embodiment immersion cooling arrangement 100 includes a condenser 120 and a heat exchanger 122. Condenser 120 is connected to an interior surface 136 of PWB 104. Heat exchanger 122 is connected to an exterior surface 134 of PWB 104 opposite condenser 120 and is in thermal communication with condenser 120 through PWB 104. As will be appreciated by those of skill in the art in view of the present disclosure, inclusion of either (or both) optional condenser 120 and heat exchanger 122 increases the rate of heat transfer between interior 106 and the external environment.

Figure 2:
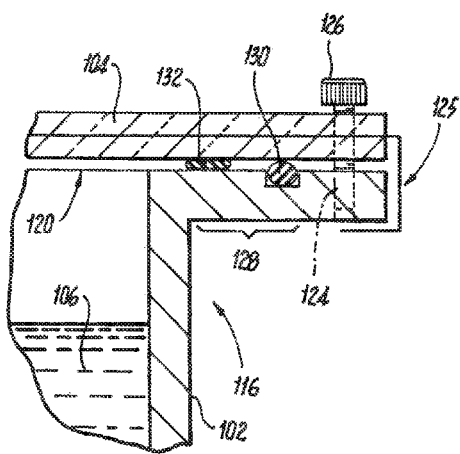
FIG. 2 is a cross-sectional side view of a portion of the immersion cooling arrangement of FIG. 1, showing sealing and fastening of the PWB to the housing.

With reference to FIG. 2, portions of housing 102 and a PWB forming PWB 104 are shown. Housing 102 is a tub-like body. Housing 102 includes a metallic material 118 (shown in FIG. 1), such as aluminum or alloy thereof, and has an open side 120. PWB 104 hermetically seats on housing 102 and spans open side 120, thereby separating interior 106 through the external environment. In the illustrated exemplary embodiment housing 102 has a flange 121 extending about open side 120 and defining a fastener pattern 124. A plurality of fasteners 126 couple (and/or fix) PWB 104 to housing 102 by threaded engagement with fastener pattern 124. Although illustrated herein as spanning an open side 120 arranged on the top (relative to gravity) of housing 102, it is to be appreciated that the open side can be a lateral side or bottom (relative to gravity) of housing 102. As will be appreciated by those of skill in the art in view of the present disclosure, providing a PWB as lateral side and/or bottom of the housing allows for placement of the electrical connections on the housing interior relatively close to the electrical device contained within the housing, reducing size and/or weight of the immersion cooling arrangement.

A hermetic seal 128 is disposed between PWB 104 and housing 102. In the illustrated exemplary embodiment hermetic seal 128 includes two sealing elements, e.g., an elastomeric sealing element 130 and metallic sealing element 132, which extend about open side 120 and between PWB 104 and housing 102. Elastomeric barrier 130 is disposed laterally between fastener pattern 124 and metallic barrier 132. Elastomeric barrier 130 may include resilient ring, such as a gasket or o-ring, compressively seated between PWB 104 and flange 121. Metallic barrier 132 can include solder or braze and joins PWB 104 to housing 102. In certain embodiments hermetic seal 128 can fix PWB 104 to housing 102.

As will be appreciated by those of skill in the art, use of solder simplifies fabrication of immersion cooling arrangement 100 as a solder metallic barrier can be formed using a wave soldering technique, which is rapid and inexpensive. As will also be appreciated by those of skill in the art in view of the present disclosure, two-part seals increases the magnitude of the pressure differential that can be sustained between housing interior 106 the ambient environment. Although a two-part sealing arrangement is shown in the illustrated exemplary embodiment, it is to be understood and appreciated that a single sealing element or more than two sealing elements can be employed, as suitable for an intended application.

In the illustrated exemplary embodiment immersion cooling arrangement 100 includes a reinforcing member 125. Reinforcing member 125 spans PWB 104 to provide additional strength to PWB 104, thereby allowing PWB 104 to retain high pressure within housing interior 106 relative to the ambient environment. Reinforcing member 125 can also couple (and/or fix) PWB 104 to housing 102. It is contemplated that reinforcing member 125 can be a strap, a plate-like structure, or a mesh body 127. In certain embodiments reinforcing member 125 can couple PWB 104 to housing 102. In accordance with certain embodiments, reinforcing member 125 can be embedded within PWB 104. It is also contemplated that reinforcing member 125 can be integral (e.g., embedded within) PWB 104, simplifying assembly of immersion cooling apparatus 100.

Figure 3:
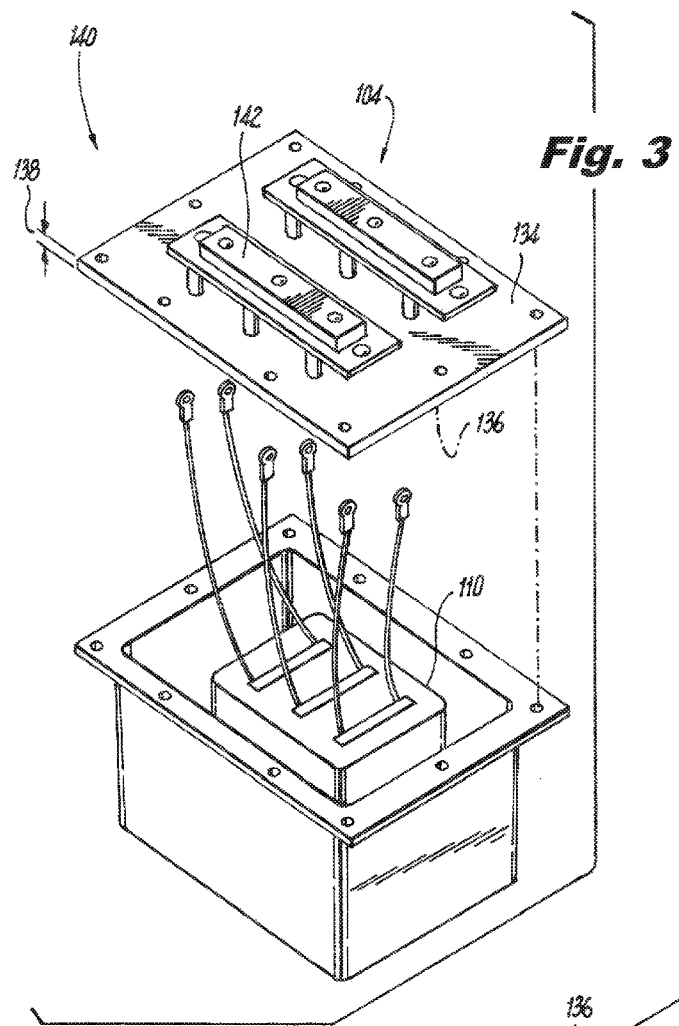
FIG. 3 is an exploded view of the immersion cooling arrangement of FIG. 1, showing the outer connectors fixed to an external surface of the PWB.

With reference to FIG. 3, PWB 104 is shown exploded away from housing 102. PWB 104 has an exterior surface 134, an opposed interior surface 136, and a thickness 138 defined between exterior surface 134 and interior surface 136. One or more external connectors 140 are arranged on exterior surface 134. The one or more external connectors are in electrical communication with electrical device 110 through, for example, through one or more electrical leads disposed within housing 102. In the illustrated exemplary embodiment external connector 140 provides power to electrical device 110 and an external connector 142 provides signal communication to electrical device, each in a penetration-free arrangement. As will be appreciated by those of skill in the art in view of the present disclosure penetration-free electrical communication reduces the likelihood of leakage through a feed-thru structure, such from thermal stress/fatigue or by being bumped during maintenance.

Figure 4:
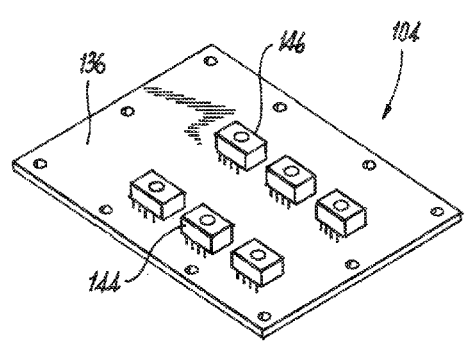
FIG. 4 is a perspective view of an interior surface of the PWB of FIG. 1, showing inner connectors fixed to the interior surface of the PWB.

With reference to FIG. 4, interior surface 136 of PWB 104 is shown. One or more internal connector 144 is arranged on interior surface 136. The one or more internal connectors are in electrical communication with electrical device 110 (shown in FIG. 1) through, for example, the through one or more electrical leads (shown in FIG. 3) disposed within housing 102. In the illustrated exemplary embodiment internal connector 144 provides power to electrical device 110 (shown in FIG. 1) and an internal connector 146 provides signal communication to electrical device, each in a penetration-free arrangement, via external connector 140 (shown in FIG. 3) and external connector 142 (shown in FIG. 3). As will be appreciated by those of skill in the art in view of the present disclosure penetration-free electrical communication reduces the likelihood of leakage through a feed-thru structure, such from thermal stress/fatigue or by being bumped during maintenance.

Figure 5A:
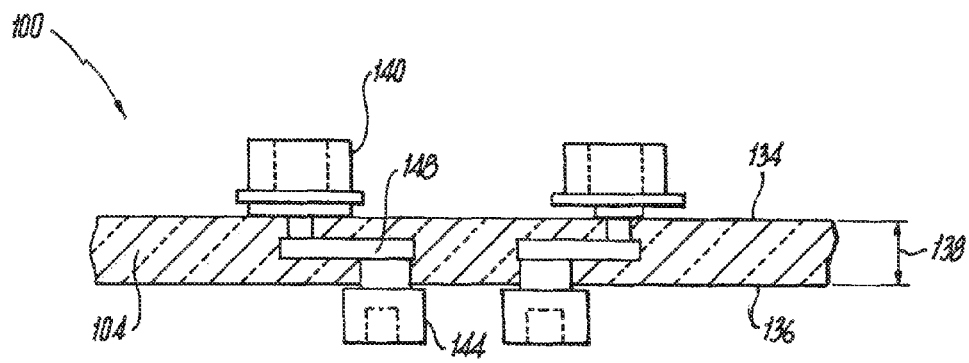
FIGS. 5A-5C are cross-sectional side view of embodiments of the PWB shown in FIG. 1, showing a conductive trace providing electrical connectivity between outer and inner connectors extending or partially through the PWB.
Figure 5B:
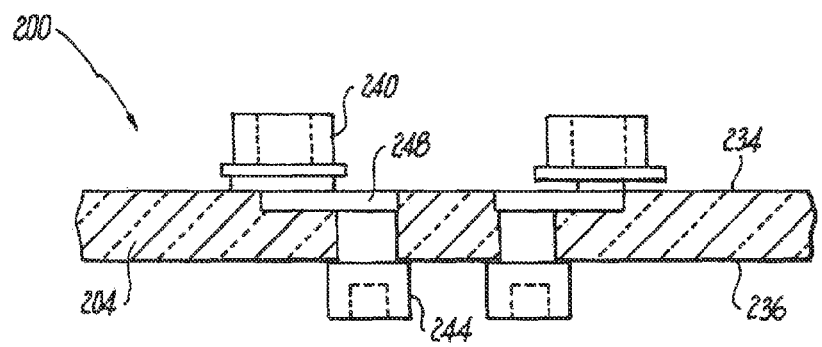
Figure 5C:
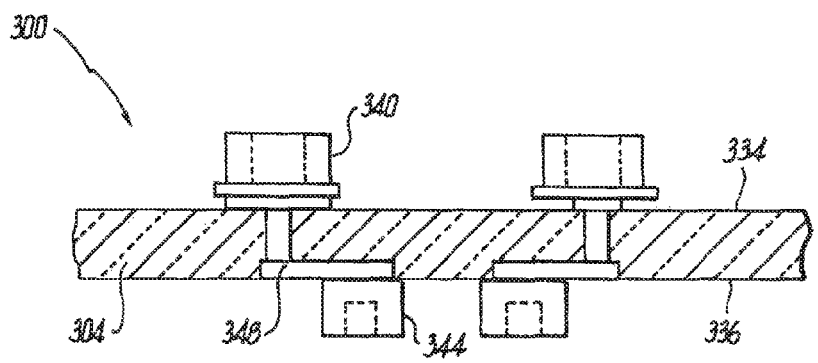

With reference to FIGS. 5A-5C, embodiments of PWB are shown in a side cross-section. Referring to FIG. 5A, PWB 104 is shown. PWB 104 includes a conductive trace 148. Conductive trace 148 electrically connects external connector 140 to internal connector 144. Conductive trace 148 is disposed within thickness 138 of PWB 104 such that electrically insulating portions of PWB 104 are disposed between exterior surface 134 and interior surface 136. External connector 140 extends only partially through thickness 138 of PWB 104 and connects to a top surface (relative to the direction of gravity) of conductive trace 148, external connector 140 thereby being in electrical communication with conductive trace 148. Internal connector 144 extends only partially through thickness 138 of PWB 104 and connects to a bottom surface (relative to the direction of gravity) of conductive trace 148, internal connector 144 thereby being in electrical communication with external connector 140 through conductive trace 148. As will be appreciated by those of skill in the art in view of the present disclosure, arranging conductive trace 148 within PWB 104 or on interior surface 136 can provide additional protection for voltage protection between structures having a voltage potential therebetween.

With reference to FIG. 5B, an immersion cooling arrangement 200 is shown. Immersion cooling arrangement 200 is similar to immersion cooling arrangement 100 and additionally includes a PWB 204. PWB 204 includes a conductive trace 248 arranged on exterior surface 234 of PWB 204. An external connector 240 is connected to exterior surface 234 of PWB 204, is electrically connected to conductive trace 248, and is in electrical communication with an internal connector 244 connected to an interior surface 236 of PWB 204. Conductive trace 248 and electrically insulating material laterally adjacent to consecutive trace 248 form a hermetic barrier which separates exterior surface 234 from interior surface 236.

With reference to FIG. 5C, an immersion cooling arrangement 300 is shown. Immersion cooling arrangement 300 is similar to immersion cooling arrangement 200 and additionally includes a PWB 304 with a conductive trace 348. Conductive trace 348 is arranged on an interior surface 336 of PWB 304. An internal connector 344 is connected to interior surface 336 of PWB 304, is electrically connected to conductive trace 348, and is in electrical communication with an external connector 340, which is connected an exterior surface 334 of PWB 304. Conductive trace 348 and electrically insulating material laterally adjacent to conductive trace 348 form a hermetic barrier which separates exterior surface 334 from interior surface 336.

Vehicles, such as terrestrial and aerial vehicles, increasingly employ immersion cooling arrangements to transfer heat between the external environment and the electrical device contained within the arrangement housing. Since the electrical device(s) disposed within the arrangement housing requires electrical communication with other devices external of the housing, electrically insulated conductors typically pass through the housing and connect to the electrical device disposed within the housing interior. Connectivity can be provided by ceramic-type feed thru structures welded or soldered to the housing and gasket-type feed thru structures, which surround the conductor to provide electrical insulation and are carefully installed prevent fluid leakage from the housing interior to external environment for reliable operation of the electrical device.

In embodiments described herein a PWB is used to cover the housing for an immersion cooling arrangement, the PWB separating the interior of the housing from the external environment. The PWB eliminates the need for a metal cover for hermetic sealing of housing. The PWB also allows for connectivity to the electrical device contained within the housing without the use of penetrations extending between the outer and inner surfaces of the PWB, eliminating the need for ceramic or o-ring type feed-thru structures for power and/or signal interconnects to the electrical device contained within the housing. In certain embodiments, the PWB can reduce the cost and complexity of the connectivity from the external environment and the electrical device contained within the housing, reducing hardware costs and assembly labor required for the immersion cooling arrangement.

The methods and systems of the present disclosure, as described above and shown in the drawings, provide for immersion cooling arrangements with superior properties including penetration-free electrical communication with the an electrical device submerged within coolant contained in the housing through a PWB covering the housing. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. An immersion cooling arrangement, comprising:
a housing configured to contain a liquid coolant;
an electrical device positionable within the housing;
a printed wiring board (PWB) having a conductive trace being sealably engagable with the housing and configured to separate the coolant from an environment external to the housing;
an outer connector coupled to an external surface of the PWB and electrically connected to the conductive trace; and
an inner connector coupled to an internal surface of the PWB and electrically connected to the conducive trace, wherein the conductive trace hermetically separates the outer connector from the inner connector.

2. The immersion cooling arrangement as recited in claim 1, further comprising a seal disposed between the PWB and a fastener pattern disposed laterally outward of the seal.

3. The immersion cooling arrangement as recited in claim 1, wherein the PWB includes a wiring trace in electrical communication with the electrical device.

4. The immersion cooling arrangement as recited in claim 1, wherein the connector extends only partially through a thickness of the PWB.

5. The immersion cooling arrangement as recited in claim 1, wherein the connector extends only partially through a thickness of the PWB.

6. The immersion cooling arrangement as recited in claim 1, wherein the connector is disposed within an ullage space defined between the PWB and the coolant.

7. The immersion cooling arrangement as recited in claim 1, further comprising a heat sink connected to an outer surface of the PWB.

8. The immersion cooling arrangement as recited in claim 1, further comprising a condenser connected to an inner surface of the PWB.

9. The immersion cooling arrangement as recited in claim 1, wherein the PWB is penetration free within a periphery of a hermetic seal defined between the PWB and the housing.

10. The immersion cooling arrangement as recited in claim 1, further comprising a reinforcing member spanning the PWB and coupling the PWB to the housing.

11. The immersion cooling arrangement as recited in claim 10, wherein the reinforcing member includes a mesh body or one or more straps connected to the housing.

12. The immersion cooling arrangement as recited in claim 1, further comprising a dielectric liquid coolant contained within the housing, wherein the electrical device is submerged within the liquid coolant.

13. The immersion cooling arrangement as recited in claim 1, wherein the electrical device includes a power converter, an inductor, or a motor drive.

14. The immersion cooling arrangement as recited in claim 1, further comprising at least one of a gasket and a solder barrier sealably disposed between the PWB and the housing.

15. The immersion cooling arrangement as recited in claim 1, wherein the conductive trace extends laterally between the outer conductor and the inner conductor.

16. The immersion cooling arrangement as recited in claim 1, wherein the conductive trace is disposed within an interior of the PWB.

17. The immersion cooling arrangement as recited in claim 1, wherein the electrical device is a first electrical device, and further comprising a second electrical device supported by the PWB.

* * * * *